(12) United States Patent
Li et al.

(10) Patent No.: US 12,153,082 B2
(45) Date of Patent: Nov. 26, 2024

(54) DETECTION METHOD FOR SENSITIVE PARTS OF IONIZATION DAMAGE IN BIPOLAR TRANSISTOR

(71) Applicant: Harbin Institute of Technology, Harbin (CN)

(72) Inventors: Xingji Li, Harbin (CN); Jianqun Yang, Harbin (CN); Gang Lv, Harbin (CN); Yadong Wei, Harbin (CN); Xiaodong Xu, Harbin (CN); Tao Ying, Harbin (CN); Xiuhai Cui, Harbin (CN)

(73) Assignee: Harbin Institute of Technology, Harbin (CN)

( * ) Notice: Subject to any disclaimer, the term of this patent is extended or adjusted under 35 U.S.C. 154(b) by 471 days.

(21) Appl. No.: 17/626,820

(22) PCT Filed: Jul. 27, 2021

(86) PCT No.: PCT/CN2021/108688
§ 371 (c)(1),
(2) Date: Jan. 13, 2022

(87) PCT Pub. No.: WO2022/022513
PCT Pub. Date: Feb. 3, 2022

(65) Prior Publication Data
US 2022/0349934 A1    Nov. 3, 2022

(30) Foreign Application Priority Data

Jul. 28, 2020 (CN) .......................... 202010735183.7

(51) Int. Cl.
*G01R 31/265* (2006.01)
*G01R 31/26* (2020.01)

(52) U.S. Cl.
CPC ..... *G01R 31/2653* (2013.01); *G01R 31/2608* (2013.01); *G01R 31/2648* (2013.01)

(58) Field of Classification Search
CPC ............ G01R 31/2653; G01R 31/2608; G01R 31/2648; G01N 23/02
See application file for complete search history.

(56) References Cited

U.S. PATENT DOCUMENTS

| | | | | |
|---|---|---|---|---|
| 2014/0165017 A1* | 6/2014 | Barnaby | ............... | G06F 30/398 716/112 |
| 2014/0217407 A1* | 8/2014 | Mizushima | ......... | H01L 29/7397 438/16 |
| 2017/0301751 A1* | 10/2017 | Agata | ..................... | H01L 29/04 |

FOREIGN PATENT DOCUMENTS

| CN | 106353344 A | * | 1/2017 | ............. G01N 23/00 |
|---|---|---|---|---|
| CN | 108254668 A | * | 7/2018 | ......... G01R 31/2601 |
| CN | 111639441 A | * | 9/2020 | ............. G06F 30/20 |

* cited by examiner

*Primary Examiner* — Akm Zakaria
(74) *Attorney, Agent, or Firm* — Chun-Ming Shih; LANWAY IPR SERVICES

(57) ABSTRACT

The present invention provides a detection method for sensitive parts of ionization damage in a bipolar transistor, which includes the following steps: selecting an irradiation source, and carrying out irradiation test on the bipolar transistor to be tested; installing the irradiated bipolar transistor on a test bench of a deep level transient spectroscopy system, and setting test parameters; selecting at least two different bias voltages, and testing the bipolar transistor to obtain a deep level transient spectrum; determining whether a defect is an ionization defect according to a peak position of the defect signal in the deep level transient spectrum; determining the defect type as oxidation trapped charges or an interface state according to the level of the defect signal in the deep level transient spectrum; and determining the sensitive area of ionization damage in the bipolar transistor according to the determination result of the defect signal type.

9 Claims, 3 Drawing Sheets

DETECTION METHOD FOR SENSITIVE PARTS OF IONIZATION DAMAGE IN BIPOLAR TRANSISTOR

TECHNICAL FIELD

The present invention relates to the technical field of electronic device detection, in particular to a detection method for sensitive parts of ionization damage in a bipolar transistor.

BACKGROUND ART

A bipolar transistor is an electric current control device, and is widely applied to broadcasting, television, communications, radar, computers, automatic control devices, electronic instruments, household appliances and other fields.

The bipolar transistor operating in the irradiation environment is affected by various particles, so that ionization damage in the bipolar transistor is caused. The bipolar transistor is composed of dielectric materials, semiconductor materials, conductive materials and interfaces thereof. The ionization effect can produce a large number of electron-hole pairs in the entire chip of the device. These electron-holes will be produced in the dielectric material, semiconductor materials, conductive materials and interface thereof at the same time. In addition, the electron-holes can be transported freely, forming stable defects through the own interaction or interaction with surrounding impurities in the transport process, which in turn affects the performance and reliability of the device. Different types of devices have different sensitivity to defects, and defects in different parts have different effects on the degradation of device performances.

How to quickly characterize the positions of these defects is the key to studying the irradiation damage and reliability of bipolar transistors, and is also a problem that needs to be solved urgently.

SUMMARY OF THE INVENTION

The problem solved by the present invention is how to identify and determine sensitive parts of damage in a bipolar transistor under the condition of ionization damage.

In order to solve the above problems, the present invention provides a detection method for sensitive parts of ionization damage in a bipolar transistor, which includes the following steps:
step S100: selecting an irradiation source, and carrying out an irradiation test on the bipolar transistor to be tested;
step S200: installing the irradiated bipolar transistor on a test bench of a deep level transient spectroscopy system, and setting test parameters;
step S300: selecting at least two different bias voltages, and testing the bipolar transistor to obtain a deep level transient spectrum;
step S400: determining whether a defect is an ionization defect according to the position of the signal peak in the deep level transient spectrum;
step S500: determining the defect type as an oxidation trapped charge signal or an interface state signal according to the level of the defect signal in the deep level transient spectrum; and
step S600: determining the sensitive area of ionization damage in the bipolar transistor according to a determination result of the defect signal type.

Optionally, the step S600 specifically includes:
if the defect signal only has the oxidation trapped charge signal, determining that the sensitive area of ionization damage in the bipolar transistor is an oxide layer β1 above a neutral base region;
if the defect signal only has the interface state signal, determining that the sensitive areas of ionization damage in the bipolar transistor are an emitter junction surface β2 and a neutral base region surface β3; and
if the defect signal contains both the oxidation trapped charge signal and the interface state signal, determining that the sensitive areas of ionization damage in the bipolar transistor are the oxide layer β1, the emitter junction surface β2, and the neutral base region surface β3.

Optionally, the step S500 specifically includes:
the band gap of a collector region of the bipolar transistor is Eg; if the level of the defect signal is less than α*Eg, determining that the defect signal is the oxidation trapped charge signal;
if the level of the defect signal is greater than α*Eg, determining that the defect signal is the interface state signal; and
α is a judgment parameter and is in the range of 0.2 to 0.5.

Optionally, the S400 specifically includes:
if the position of the signal peak does not change with the bias voltage, determining that the defect is an inherent defect; and
if the peak position of the defect signal shifts with the change of the bias voltage, determining that the defect is an ionization defect.

Optionally, in the step S100, the irradiation source is selected from one of X-rays, gamma-rays, photons or neutrons.

Optionally, in the step S100, the irradiation source includes charged particles.

Optionally, the S100 specifically includes:
selecting the charged particles as the irradiation source;
calculating the incident depth of the charged particles in the bipolar transistor by adopting a Monte Carlo method to ensure that the incident depth is greater than the thickness of the oxide layer of the bipolar transistor;
calculating the ionizing absorbed dose $I_d$ and the displacement absorbed dose $D_d$ of the charged particles in the bipolar transistor by adopting the Monte Carlo method to ensure that $\log[(I_d+D_d)/D_d]$ is greater than 5;
and carrying out irradiation test on the bipolar transistor.

Optionally, in the step S100, the change rate of electrical performance parameters of the bipolar transistor is controlled to be greater than or equal to 20% during irradiation test.

Optionally, in the step S200, the test parameters are specifically as follows: the temperature scan range is 4K to 300K, the step size is 0.1K, the maximum reversed bias voltage $V_R$ is less than 50% of the rated voltage of the bipolar transistor, the pulse voltage is less than or equal to the maximum reversed bias voltage $V_R$, and the pulse time is 1 ns to 1 s.

Optionally, in the step S300, a range of the bias voltage is $0.1*V_R$ to $V_R$, wherein $V_R$ is the maximum reversed bias voltage.

Compared with the prior art, the detection method provided by the present invention is based on deep level transient spectrum analysis to determine the characteristics of ionization defects of the bipolar transistor, distinguish the oxidation trapped charge defect and the interface state defect. On this basis, the sensitive parts of ionizing radiation damage in the bipolar transistor are determined, and the purpose of detecting and determining the sensitive parts of ionization damage is achieved.

The detection and determination method for the sensitive parts of ionization damage in the bipolar transistor has simple steps, is easy to operate, and can greatly reduce the cost of the test.

The detection method provided by the present invention can quickly determine and evaluate the sensitive area of irradiation damage in the bipolar transistor, and is beneficial to advancing the research on the equivalence problem of the performance degradation of the bipolar device and the anti-radiation reinforcement technology under the irradiation environment.

DETAILED DESCRIPTION OF THE INVENTION

For making the above objects, characteristics and advantages of the present invention more obvious and understandable, detailed description will be made to the specific embodiments of the present invention in conjunction with drawings. It should be noted that the following embodiments are only used to illustrate the implementation methods and typical parameters of the present invention, and are not used to limit the scope of the parameters of the present invention, and reasonable changes derived therefrom are still under the protection of the claims of the present invention.

The embodiment of the present invention discloses a detection method for sensitive parts of ionization damage in a bipolar transistor. Protons, electrons, heavy ions, neutrons and photons which have different energy in the radiation environment can induce a large number of ionization defects in the bipolar transistor, which cause ionizing irradiation damage. Bipolar transistors are divided into NPN-type bipolar transistors and PNP-type bipolar transistors. The ionization effect can cause oxidation trapped charges and interface states in the NPN-type bipolar transistors and the PNP-type bipolar transistors. The bipolar transistors are respectively of vertical structures, substrate structures and lateral structures. The bipolar transistors with different structural characteristics have different sensitive parts of ionizing radiation damage, some sensitive parts are in a passivation layer, and some sensitive parts are on the interface between a passivation layer and a semiconductor. When a transistor is damaged by ionization, the oxidation trapped charge defect and the interface state defect have different influence on the performance degradation of transistors of different types and structural characteristics. Therefore, it is very important to quickly determine and evaluate the sensitive areas of irradiation damage in the bipolar transistor, which is beneficial to the research on the equivalence problem of performance degradation of the bipolar devices under the radiation environment and the anti-irradiation hardening technology. The embodiments of the present invention are based on deep level transient spectrum analysis to determine the characteristics of the ionization defect of the bipolar transistor and distinguish the oxidation trapped charge defect and the interface state defect, on this basis, the sensitive parts of ionizing irradiation damage in the bipolar transistor are determined, and the purpose of detecting and determining the sensitive parts of ionization damage is achieved.

Figure 1:
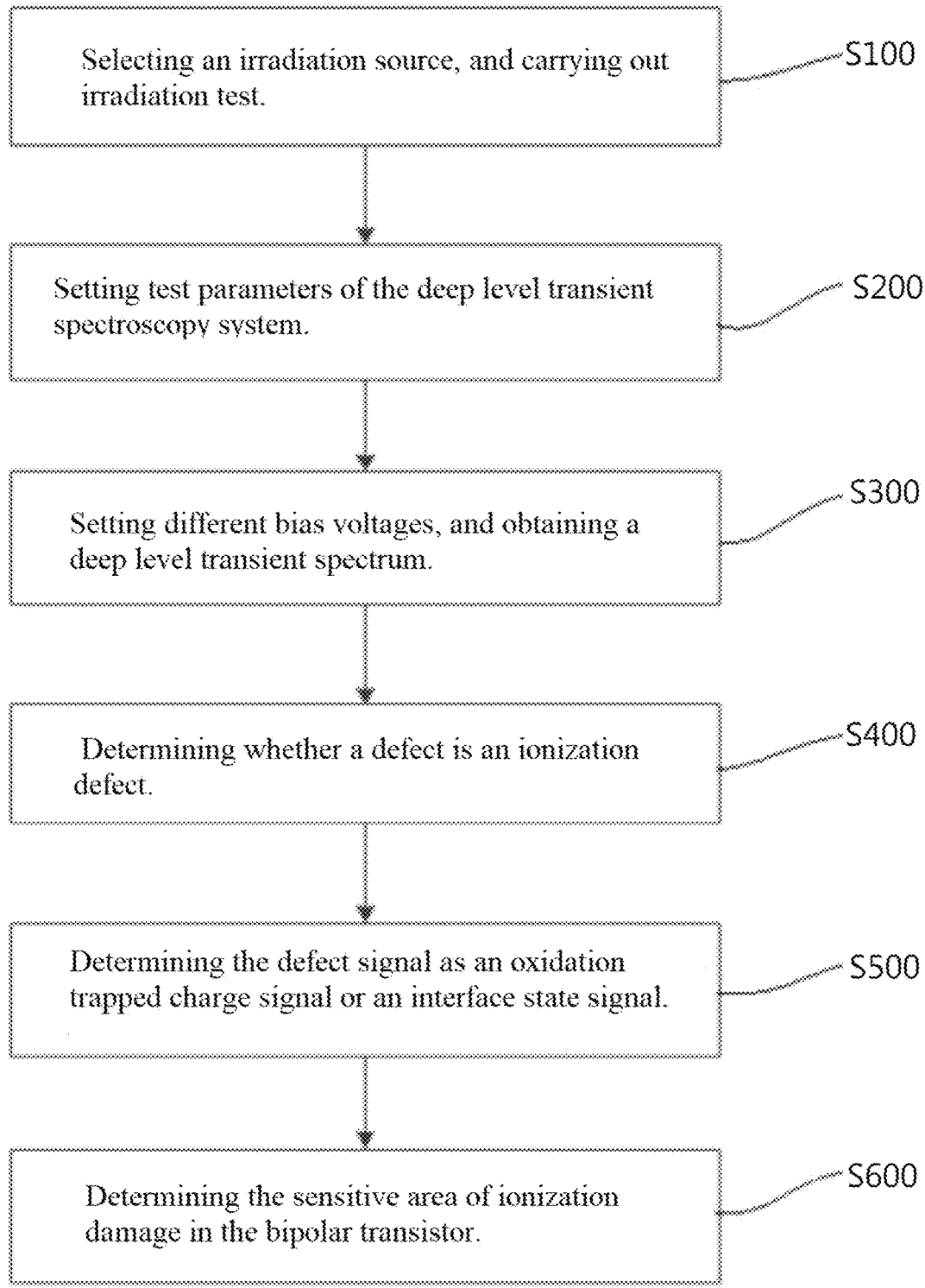
FIG. 1 is a flow chart of a detection method for sensitive parts of ionization damage in a bipolar transistor according to an embodiment of the present invention.

As shown in FIG. 1, a detection method for sensitive parts of ionization damage in the bipolar transistor includes the following steps:

Step S100: selecting X-rays, gamma-rays, photons, neutrons or charged particles as an irradiation source, carrying out irradiation test on the bipolar transistor to be tested, and controlling a change rate of electrical performance parameters of the bipolar transistor to be greater than or equal to 20% during irradiation test.

If the X-rays, gamma-rays, photons or neutrons are selected as the irradiation source, the irradiation test can be carried out directly.

If the charged particles are selected as the irradiation source, the confirmation steps are as follows:

Calculating an incident depth d of the charged particles in the bipolar transistor by adopting Geant4 software to ensure that the incident depth d is greater than the thickness a of the oxide layer of the bipolar transistor.

Calculating the ionizing absorbed dose $I_d$ and displacement absorbed dose $D_d$ of the charged particles in the bipolar transistor by adopting Geant4 software to ensure that log $[(I_d+D_d)/D_d]$ is greater than 5. If log$[(I_d+D_d)/D_d]$ is less than 5, the charged particles are selected again; and if log$[(I_d+D_d)/D_d]$ is greater than 5, it indicates that stable ionization defects are generated in the bipolar transistor, the selected charged particles are suitable, and the irradiation test can be carried out.

In other embodiments, the calculation software used in the confirmation steps may also be other software based on Monte Carlo methods such as SRIM, MCNP, HITMC.

Step S200: installing the irradiated bipolar transistor on a test bench of a deep level transient spectroscopy system, and setting test parameters, wherein the specific test parameters are as follows: the temperature scan range is 4K to 300K, the step size is 0.1K, the maximum reversed bias voltage $V_R$ is less than 50% of the rated voltage of the bipolar transistor, the pulse voltage is less than or equal to the maximum reversed bias voltage $V_R$, and the pulse time is 1 ns to 1 s.

Step S300: selecting at least two different bias voltages, wherein the bias voltages are in the range of $0.1V_R$ to $V_R$, $V_R$ is the maximum reversed bias voltage, and carrying out deep level transient spectrum analysis on a collector junction of the bipolar transistor to obtain a deep level transient spectrum.

Step S400: determining whether a defect is an ionization defect according to a peak position of the defect signal in the deep level transient spectrum. The specific determination method includes the steps of: observing the change of the peak position of the defect signal; if the peak position of the defect signal does not change with the bias voltage, determining that the defect is an inherent defect, the inherent defect is the inherent defect of an electronic device, and is not caused by irradiation; and if the peak position of the defect signal shifts with the change of the bias voltage, determining that the defect is the ionization defect, and as the ionization defect is a continuous level, and the level changes with the voltage.

Step S500: determining the defect signal as an oxidation trapped charge signal or an interface state signal according to the level of the defect signal in the deep level transient spectrum. The specific determination method includes the steps that: the band gap of the collector region of the bipolar transistor is represented by Eg; if the level of the defect signal is less than α*Eg, determining that the defect signal is the oxidation trapped charge signal; if the level of the defect signal is greater than α*Eg, determining that the defect signal is the interface state signal; and α is a judgment parameter and is in the range of 0.2 to 0.5.

Preferably, α is 0.4. That is, for the NPN transistor, if the level is less than Ec−0.4*Eg, the defect type is the oxidation trapped charge defect; if the level is greater than Ec−0.4*Eg, the defect type is the interface state defect, and Ec is the level of the conduction band bottom of the semiconductor material in the collector region. For the PNP transistors, if the level is less than Ev+0.4*Eg, the defect type is the oxidation trapped charge, if the level is greater than Ev+0.4*Eg, the defect type is the interface state defect, and Ev is the level of the valence band top of the semiconductor material in the collector region.

Step S600: determining the sensitive area of ionization damage in the bipolar transistor according to the determination result of the type of the defect signal. The specific determination method includes the steps that:

- if the defect signal only has the oxidation trapped charge signal, determining that the sensitive area of ionization damage in the bipolar transistor is an oxide layer β1 above the neutral base region, preferably, the sensitive area of ionization damage is the oxide layer within 50 nm above the neutral base region as the ionization damage defect only exists in the semiconductor oxide layer;
- if the defect signal only has the interface state signal, determining that the sensitive areas of ionization damage in the bipolar transistor is an emitter junction surface β2 and a neutral base region surface β3 as the interface state defect only exists on the interface between the semiconductor and the oxide;
- if the defect signal contains both the oxidation trapped charge signal and the interface state signal, determining that the sensitive areas of ionization damage in the bipolar transistor are the oxide layer β1, the emitter junction surface β2 and the neutral base region surface β3.

The detection and determining method for sensitive parts of ionization damage in the bipolar transistor provided by the embodiments of the present invention has simple steps, is easy to operate, and can greatly reduce the cost of the test. The detection method can quickly determine and evaluate the sensitive area of irradiation damage in the bipolar transistor, and is beneficial to advancing the research on the equivalence problem of the performance degradation of the bipolar device in the irradiation environment and the anti-irradiation reinforcement technology.

Embodiment I

This embodiment provides a detection method for sensitive parts of ionization damage in a bipolar transistor, which specifically includes the following steps:

Step S100: selecting Co-60 as the gamma-ray irradiation source, carrying out irradiation test on the bipolar transistor to be tested, wherein the change rate of the current gain of the bipolar transistor reaches 80% during irradiation test.

Step S200: installing the irradiated bipolar transistor on the test bench of the deep level transient spectroscopy system, and setting test parameters, wherein the temperature scan range is 30K to 300K, the step size is 0.1K, the maximum reversed bias voltage $V_R$ is 10V, the pulse voltage is minus 9.8V, and the pulse time is 100 ms.

Figure 2:
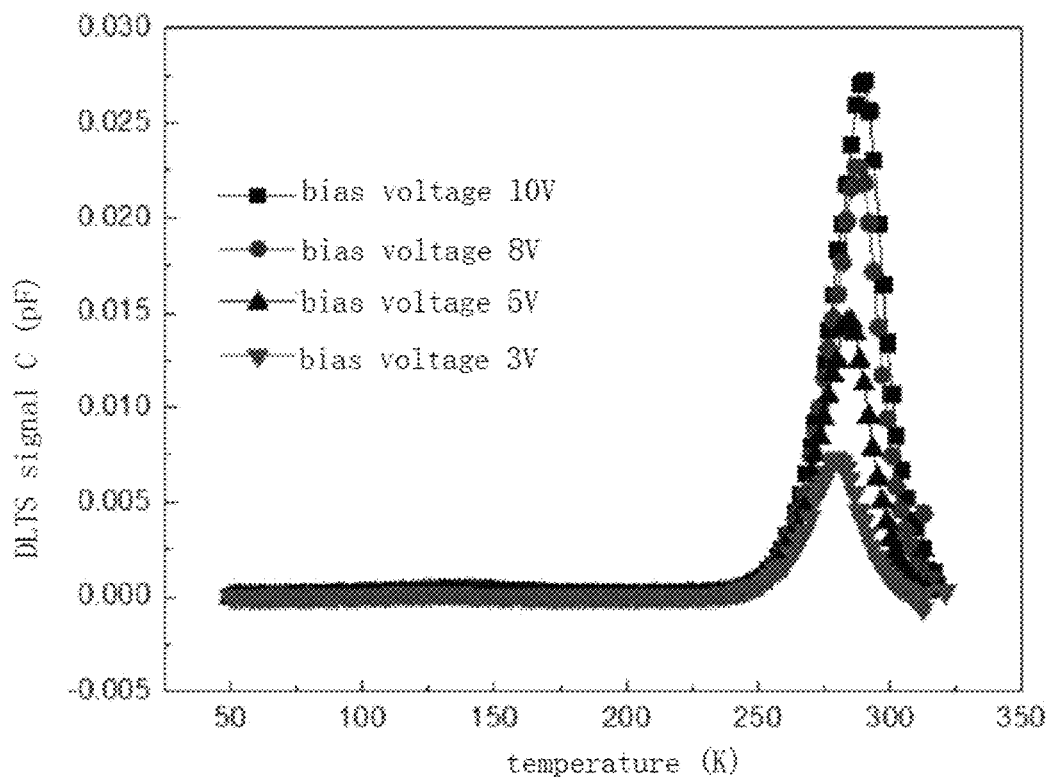
FIG. 2 is a deep level transient spectrum obtained by testing the bipolar transistor according to a first embodiment of the present invention.

Step S300: carrying out deep level transient spectrum analysis on the collector junction of the bipolar transistor under the conditions of 10V, 8V, 5V and 3V to obtain the deep level transient spectrum as shown in FIG. 2.

Step S400: determining whether the defect is the ionization defect according to the peak position of the defect signal in the deep level transient spectrum. As shown in FIG. 2, the peak position of the defect signal gradually shifts to the left with the decrease of the bias voltage. That is, the peak position of the defect signal gradually decreases, and therefore, the defect is the ionization defect.

Step S500: determining the defect signal as the oxidation trapped charge signal or the interface state signal according to the level of the defect signal in the deep level transient spectrum; and the deep level transient spectrum shows that the level of the defect signal is greater than Ec−0.4*Eg, wherein Ec is the level of the conduction band bottom of the semiconductor material in the collector region, Eg is the band gap of the collector region of the bipolar transistor, and therefore, the defect signal is the interface state signal.

Step S600: determining the sensitive area of ionization damage in the bipolar transistor according to the determination result of the defect signal type, wherein the sensitive area of ionization damage in the bipolar transistor is the emitter junction surface β2 and the entire neutral base region surface β3.

Embodiment II

This embodiment provides a detection method for sensitive parts of ionization damage in a bipolar transistor, which specifically includes the following steps:

Step S100: selecting photons as the irradiation source, carrying out irradiation test on the PNP bipolar transistor to be tested, wherein the irradiation dose is 100 krad, and the change rate of the current gain of the irradiated bipolar transistor reaches 60%.

Step S200: installing the irradiated bipolar transistor on the test bench of the deep level transient spectroscopy system, and setting test parameters, wherein the temperature scan range is 30K to 300K, the step size is 0.1K, the maximum reversed bias voltage $V_R$ is minus 10V, the pulse voltage is 10V, and the pulse time is 10 ms.

Figure 3:
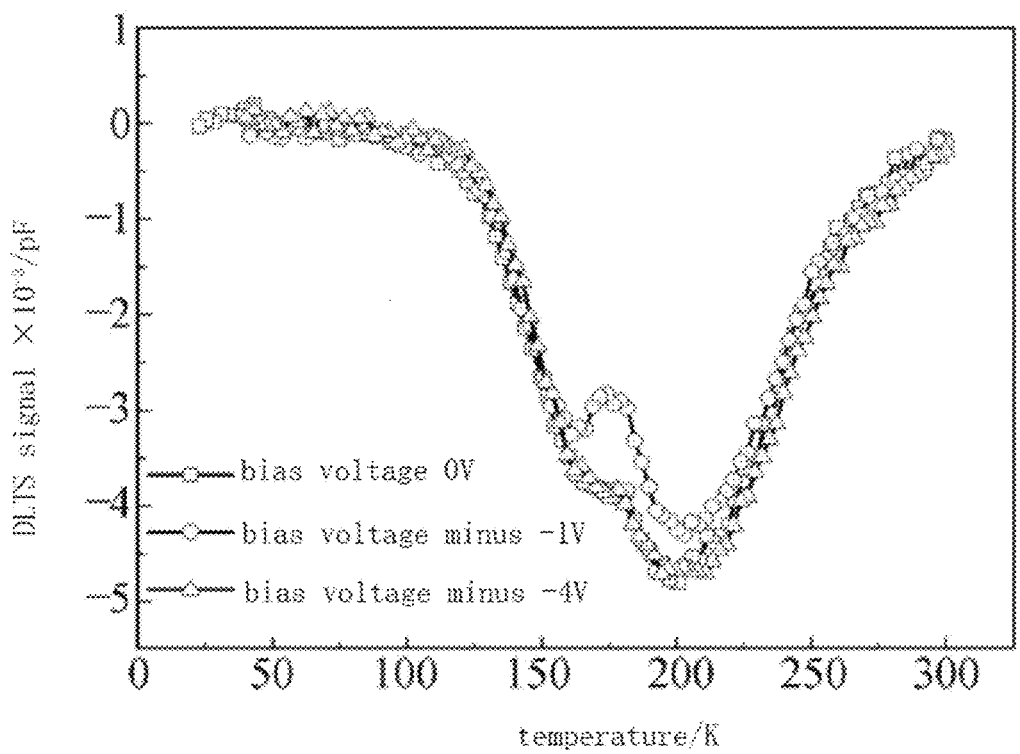
FIG. 3 is a deep level transient spectrum obtained by testing the bipolar transistor according to a second embodiment of the present invention.

Step S300: carrying out deep level transient spectrum analysis on the collector junction of the bipolar transistor under the conditions of "−4V", "−1V" and "0V" to obtain the deep level transient spectrum as shown in FIG. 3.

Step S400: determining whether the defect is the ionization defect according to the peak position of the defect signal in the deep level transient spectrum. As shown in FIG. 3, the peak position of the defect signal gradually shifts to the left with the decrease of the bias voltage. That is, the peak position of the defect signal gradually decreases, and therefore, the defect is the ionization defect.

Step S500: determining the defect signal as the oxidation trapped charge signal or the interface state signal according to the level of the defect signal in the deep level transient spectrum, wherein the deep level transient spectrum shows that the level of the defect signal is less than Ev+0.4*Eg, wherein Ec is the level of the valence band top of the semiconductor material in the collector region, Eg is the band gap of the collector region of the bipolar transistor, and therefore, the defect signal is the oxidation trapped charge signal.

Step S600: determining the sensitive area of ionization damage in the bipolar transistor according to the determination result of the defect signal type, wherein the sensitive area of the ionization damage in the bipolar transistor is the oxide layer β1 above the neutral base region, specifically, the oxide layer within the range of 50 nm above the neutral base region Embodiment III This embodiment provides a detection method for sensitive parts of ionization damage in a bipolar transistor, which specifically includes the following steps:

Step S100: selecting the charged particles as the irradiation source;

calculating the incident depth d of the charged particles in the bipolar transistor by adopting Geant4 software to ensure that the incident depth d is greater than the thickness a of the oxide layer of the bipolar transistor;

calculating the ionizing absorbed dose $I_d$ and displacement absorbed dose $D_d$ of the charged particles in the bipolar transistor by adopting Geant4 software to ensure that log $[(I_d+D_d)/D_d]$ is greater than 5; and carrying out irradiation test on the PNP bipolar transistor to be tested, wherein the irradiation dose is 110 keV, and the change rate of the current gain of the irradiated bipolar transistor reaches 70%.

Step S200: installing the irradiated bipolar transistor on the test bench of the deep level transient spectroscopy system, and setting test parameters, wherein the temperature scan range is 20K to 325K, the step size is 0.1K, the maximum reversed bias voltage $V_R$ is "−10V", the pulse voltage is minus 0.1V, the pulse time is 100 ms, and the test period is 2.48 s.

Figure 4:
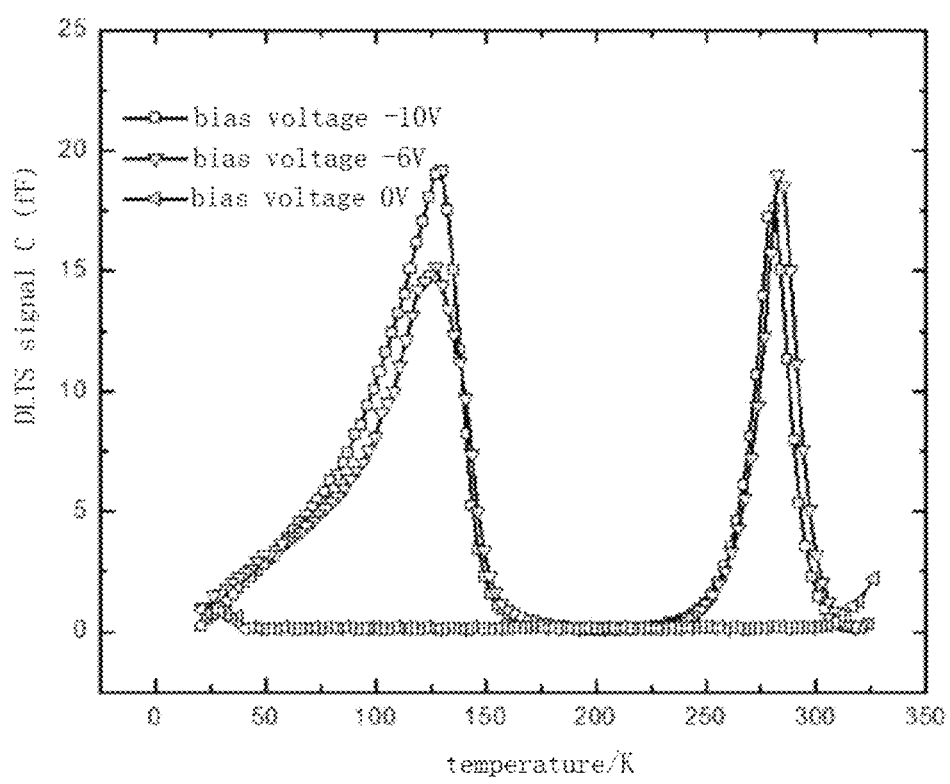
FIG. 4 is a deep level transient spectrum obtained by testing the bipolar transistor according to a third embodiment of the present invention.

Step S300: carrying out deep level transient spectrum analysis on the collector junction of the bipolar transistor under the conditions of "−10V", "−6V" and "0V" to obtain the deep level transient spectrum as shown in FIG. 4.

Step S400: determining whether the defect is the ionization defect according to the peak position of the defect signal in the deep level transient spectrum. As shown in FIG. 4, the peak position of the defect signal gradually shifts to the left with the decrease of the bias voltage. That is, the peak position of the defect signal gradually decreases, and therefore, the defect is the ionization defect.

Step S500: determining the defect signal as the oxidation trapped charge signal or the interface state signal according to the level of the defect signal in the deep level transient spectrum; and the deep level transient spectrum shows that two defect signal peaks exist, the level of the defect signal on the left side is less than Ev−0.4*Eg, wherein Ec is the level of the conduction band top of the semiconductor material in the collector region, Eg is the band gap of the collector region of the bipolar transistor, and therefore, the defect signal on the left side is the oxidation trapped charge signal. The level of the defect signal on the right side is greater than Ev−0.4*Eg, and therefore, the defect signal on the right side is the interface state signal.

Step S600: determining the sensitive area of ionization damage in the bipolar transistor according to the determination result of the defect signal type, wherein the sensitive areas of ionization damage in the bipolar transistor are the oxide layer β1, the emitter junction surface β2 and the neutral base region surface β3.

The above embodiments show that the detection method for the sensitive parts of ionization damage in the bipolar transistor disclosed by the present invention can quickly determine and evaluate the sensitive area of radiation damage in the bipolar transistor, has simple steps and broad application prospects and is easy to operate.

Although the present invention is as described above, the protection scope of the present invention is not limited to this. Various changes and modifications can be made by those skilled in the art without departing from the spirit and scope of the present invention, and these changes and modifications will fall within the protection scope of the present invention.

The invention claimed is:

1. A detection method for sensitive parts of ionization damage in a bipolar transistor, comprising the following steps:
    step S100: selecting an irradiation source, and carrying out an irradiation test on a bipolar transistor to be tested;
    step S200: installing the irradiated bipolar transistor on a test bench of a deep level transient spectroscopy system, and setting test parameters;
    step S300: selecting at least two different bias voltages, and testing the bipolar transistor to obtain a deep level transient spectrum;
    step S400: determining whether a defect signal is an ionization defect according to a peak position of the defect signal in the deep level transient spectrum;
    step S500: determining a type of the defect signal as an oxidation trapped charge signal or an interface state signal according to a level of the defect signal in the deep level transient spectrum; and
    step S600: determining a sensitive area of ionization damage in the bipolar transistor according to a determination result of the type of the defect signal;
    wherein the step S500 comprises:
    a band gap of a collector region of the bipolar transistor is presented by Eg;
    if the level of the defect signal is less than α*Eg, determining that the defect signal is the oxidation trapped charge signal; and
    if the level of the defect signal is greater than α*Eg, determining that the defect signal is the interface state signal;
    wherein α is a judgment parameter and is in a range of 0.2 to 0.5.

2. The detection method for sensitive parts of ionization damage in a bipolar transistor of claim 1, wherein the step S600 comprises:
    if the defect signal only has the oxidation trapped charge signal, determining that the sensitive area of ionization damage in the bipolar transistor includes an oxide layer β1 above a neutral base region;
    if the defect signal only has the interface state signal, determining that the sensitive area of ionization damage in the bipolar transistor includes an emitter junction surface β2 and a neutral base region surface β3; and
    if the defect signal contains both the oxidation trapped charge signal and the interface state signal, determining that the sensitive area of ionization damage in the bipolar transistor includes the oxide layer β1, the emitter junction surface β2, and the neutral base region surface β3.

3. The detection method for sensitive parts of ionization damage in a bipolar transistor of claim 1, wherein the step S400 comprises:

if the peak position of the defect signal does not change with a change of the bias voltage, determining that the defect signal is an inherent defect; and if the peak position of the defect signal shifts with the change of the bias voltage, determining that the defect signal is an ionization defect.

4. The detection method for sensitive parts of ionization damage in a bipolar transistor of claim 1, wherein in the step S100, the irradiation source is selected from one of X-rays, gamma-rays, photons or neutrons.

5. The detection method for sensitive parts of ionization damage in a bipolar transistor of claim 1, wherein in the step S100, the irradiation source includes charged particles.

6. The detection method for sensitive parts of ionization damage in a bipolar transistor of claim 5, wherein the step S100 comprises:

selecting the charged particles as the irradiation source;

calculating an incident depth of the charged particles in the bipolar transistor by adopting a Monte Carlo method to ensure that the incident depth is greater than a thickness of an oxide layer of the bipolar transistor;

calculating an ionizing absorbed dose $I_d$ and a displacement absorbed dose $D_d$ of the charged particles in the bipolar transistor by adopting the Monte Carlo method to ensure that $\log[(I_d+D_d)/D_d]$ is greater than 5; and carrying out the irradiation test on the bipolar transistor.

7. The detection method for sensitive parts of ionization damage in a bipolar transistor of claim 1, wherein in the step S100, a change rate of electrical performance parameters of the bipolar transistor is controlled to be greater than or equal to 20% during the irradiation test.

8. The detection method for sensitive parts of ionization damage in a bipolar transistor according to claim 1, wherein in the step S200, the test parameters are as follows: a temperature scan range is 4K to 300K, a step size is 0.1K, a maximum reversed bias voltage $V_R$ is less than 50% of a rated voltage of the bipolar transistor, a pulse voltage is less than or equal to the maximum reversed bias voltage $V_R$, and a pulse time is 1ns to 1s.

9. The detection method for sensitive parts of ionization damage in a bipolar transistor according to claim 8, wherein in the step S300, a range of the bias voltage is $0.1*V_R$ to $V_R$, wherein $V_R$ is the maximum reversed bias voltage.

* * * * *